(12) United States Patent
Nakanishi et al.

(10) Patent No.: US 11,957,001 B2
(45) Date of Patent: Apr. 9, 2024

(54) DISPLAY DEVICE AND METHOD OF MANUFACTURING DISPLAY DEVICE

(71) Applicant: SHARP KABUSHIKI KAISHA, Sakai (JP)

(72) Inventors: Youhei Nakanishi, Sakai (JP); Shota Okamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 492 days.

(21) Appl. No.: 17/277,633

(22) PCT Filed: Sep. 27, 2018

(86) PCT No.: PCT/JP2018/036062
§ 371 (c)(1),
(2) Date: Mar. 18, 2021

(87) PCT Pub. No.: WO2020/065859
PCT Pub. Date: Apr. 2, 2020

(65) Prior Publication Data
US 2021/0351251 A1    Nov. 11, 2021

(51) Int. Cl.
*H10K 59/122* (2023.01)
*G09F 9/30* (2006.01)
*H05B 33/10* (2006.01)
*H05B 33/12* (2006.01)
*H05B 33/22* (2006.01)
*H10K 50/15* (2023.01)
*H10K 50/16* (2023.01)
(Continued)

(52) U.S. Cl.
CPC ............. *H10K 59/122* (2023.02); *G09F 9/30* (2013.01); *H05B 33/10* (2013.01); *H05B 33/12* (2013.01); *H05B 33/22* (2013.01); *H10K 50/15* (2023.02); *H10K 50/16* (2023.02); *H10K 50/171* (2023.02); *H10K 59/121* (2023.02); *H10K 99/00* (2023.02); *H10K 59/35* (2023.02)

(58) Field of Classification Search
CPC .................................................. H10K 59/122
See application file for complete search history.

(56) References Cited

U.S. PATENT DOCUMENTS 7,336,030 B2 * 2/2008 Funamoto ............ H10K 71/135
                                                          313/506
9,773,848 B2 * 9/2017 Shinokawa .......... H10K 59/122
(Continued)

FOREIGN PATENT DOCUMENTS

JP    2006-245525 A    9/2006
JP    2007-103032 A    4/2007
(Continued)

*Primary Examiner* — Bilkis Jahan
*Assistant Examiner* — Victor V Barzykin
(74) *Attorney, Agent, or Firm* — ScienBiziP, P.C.

(57) ABSTRACT

A bank has an opening including a first opening and a second opening. The second opening extends from the first opening in such a direction that the second opening overlaps the first electrode. The second opening at least partially overlaps the first electrode. The first electrode has an end close to the first opening and overlapping the second opening. The second opening has a maximum width smaller than a maximum width of the first opening. The widths are measured perpendicular to the direction in which the second opening extends from the first opening.

13 Claims, 7 Drawing Sheets

(51) Int. Cl.
*H10K 50/17* (2023.01)
*H10K 59/121* (2023.01)
*H10K 59/35* (2023.01)
*H10K 99/00* (2023.01)

(56) References Cited

U.S. PATENT DOCUMENTS

| | | | | |
|---|---|---|---|---|
| 2005/0082966 | A1* | 4/2005 | Yamazaki | H10K 59/12 |
| | | | | 313/499 |
| 2005/0116632 | A1* | 6/2005 | Funamoto | H10K 71/135 |
| | | | | 313/506 |
| 2006/0178014 | A1 | 8/2006 | Moriya et al. | |
| 2007/0194307 | A1* | 8/2007 | Kim | H10K 50/82 |
| | | | | 257/40 |
| 2014/0367669 | A1* | 12/2014 | Takeuchi | H10K 59/122 |
| | | | | 438/34 |
| 2015/0001475 | A1* | 1/2015 | Kim | H10K 59/122 |
| | | | | 438/34 |
| 2016/0172422 | A1* | 6/2016 | Kim | H10K 71/191 |
| | | | | 438/34 |
| 2016/0293681 | A1* | 10/2016 | Shinokawa | H10K 59/122 |
| 2017/0069694 | A1* | 3/2017 | Ajiki | H10K 59/122 |
| 2017/0294494 | A1* | 10/2017 | Kim | H10K 59/35 |
| 2018/0190737 | A1* | 7/2018 | Yang | H10K 71/00 |
| 2020/0091259 | A1* | 3/2020 | Han | H10K 59/124 |
| 2020/0185475 | A1* | 6/2020 | Kim | H10K 59/126 |
| 2020/0194521 | A1* | 6/2020 | Kim | H10K 50/813 |

FOREIGN PATENT DOCUMENTS

| | | |
|---|---|---|
| JP | 2012-234748 A | 11/2012 |
| JP | 2018-110099 A | 7/2018 |

* cited by examiner

DISPLAY DEVICE AND METHOD OF MANUFACTURING DISPLAY DEVICE

TECHNICAL FIELD

The present disclosure relates to display devices and methods of manufacturing display devices.

BACKGROUND ART

Various display devices have been developed. Among them, those display devices including organic light-emitting diodes (OLEDs), inorganic light-emitting diodes, or quantum dot light-emitting diodes (QLEDs) are attracting especially much attention, for example, for their low power consumption, small thickness, and high image quality.

In the field of display devices such as OLED and QLED display devices, attempts have been made to form functional layers such as a light-emitting layer, a hole transport layer, and a hole injection layer by inkjet printing or other like dispensation technology, instead of vapor deposition, to manufacture high-definition display devices at low cost.

To form functional layers such as a light-emitting layer, a hole transport layer, and a hole injection layer by inkjet printing or other like dispensation technology, banks are needed in defining the extent of the functional layers and separating pixels.

For instance, Japanese Unexamined Patent Application Publication, Tokukai, No. 2012-234748 (published Nov. 29, 2012) describes banks for defining the extent of the functional layers and separating pixels.

CITATION LIST

Patent Literature

SUMMARY

Technical Problem

The following problems can occur, however, when the banks shaped as described in Patent Literature 1 are used in combination with inkjet printing or other like dispensation technology to form functional layers such as a light-emitting layer, a hole transport layer, and a hole injection layer.

Portion (a) of FIG. 10 is an illustration of the coffee ring effect during the formation of a functional layer 110 such as a hole transport layer or a hole injection layer inside an opening 103K in a bank 103 by inkjet printing or other like dispensation technology. Portion (b) of FIG. 10 is a plan view of an active matrix substrate 101 including the bank 103 shown in (a) of FIG. 10.

Referring to (a) of FIG. 10, the active matrix substrate 101 includes thereon a plurality of thin film transistors (TFTs) (not shown) as active elements. The active matrix substrate 101 further includes thereon a plurality of first electrodes 102 respectively connected electrically to, and driven by, these TFTs.

The bank 103 covers edges of the first electrodes 102, but leaves parts of the rust electrodes 102 exposed in the openings 103K in the bank 103.

When the functional layer 110 such as a hole transport layer or a hole injection layer is formed by inkjet printing or other like dispensation technology using the bank 103, the resultant functional layer 110 is too thin or barely existent in the central part of the first electrode 102, that is, on the central part of the pixel, due to the coffee ring effect as shown in (a) and (b) of FIG. 10. Short-circuiting and/or other defects can occur where the functional layer 110 is too thin or barely existent.

The "coffee ring" develops, for example, by the following mechanism. If light-emitting layers 106R, 106G, and 106B are to be formed of a QD colloidal solution such as QD ink or if the functional layers 110 are to be formed of a colloidal solution, the solution is dispensed dropwise, and then the dispensed liquid drop is dried. The liquid drop volatilizes quickly along the periphery of the pixel where the liquid drop is thin. That generates a flow of the solution from the central part of the pixel to the edge thereof, thereby causing the colloid to collect on the edge. The resultant film is hence thin in the central part of the pixel, forming a coffee ring.

The present disclosure, made in view of these problems, has an object to provide a display device that includes functional layers, such as a light-emitting layer, a hole transport layer, and a hole injection layer, formed by dispensation and that is still less likely to develop short-circuiting and related defects and also to provide a method of manufacturing such a display device.

The present disclosure, made in view of the problems, has an object to provide a display device that has at least one of the functional layers therein formed by dispensation and that is still capable of preventing light emission defects and also to provide a method of manufacturing such a display device.

Solution to Problem

To address these problems, the present disclosure is directed to a display device including: a pixel including: a first electrode; a second electrode; and a light-emitting layer between the first and second electrodes; and a bank covering a part of the first electrode, wherein the bank has an opening including a first opening and a second opening extending from the first opening in such a direction that the second opening overlaps the first electrode, the second opening at least partially overlaps the first electrode, the first electrode has an end located close to the first opening and overlapping either the second opening or a periphery of the first opening, and the second opening has a maximum width smaller than a maximum width of the first opening, the widths being measured perpendicular to a direction in which the second opening extends from the first opening.

To address these problems, the present disclosure is directed to a method of manufacturing a display device, the method including: forming a first electrode; forming a bank covering a part of the first electrode; and forming a functional layer including at least a light-emitting layer, wherein in the forming of the bank covering a part of the first electrode, an opening including a first opening and a second opening is formed in the bank, the second opening extending from the first opening in such a direction that the second opening overlaps the first electrode, and in the forming of the functional layer including at least a light-emitting layer, a material for the functional layer is dispensed dropwise in the first opening to form the functional layer in the second opening.

Advantageous Effects

The present disclosure, in an aspect thereof, can provide a display device that has at least one of the functional layers therein formed by dispensation and that is still capable of preventing light emission defects and can also provide a method of manufacturing such a display device.

BRIEF DESCRIPTION OF DRAWINGS

Portion (a) of FIG. 1 is an illustration of a shape of openings in a bank in a display device in accordance with Embodiment 1, and (b) of FIG. 1 is a cross-sectional view taken along line A-A in (a) of FIG. 1.

DESCRIPTION OF EMBODIMENTS

Figure 1:
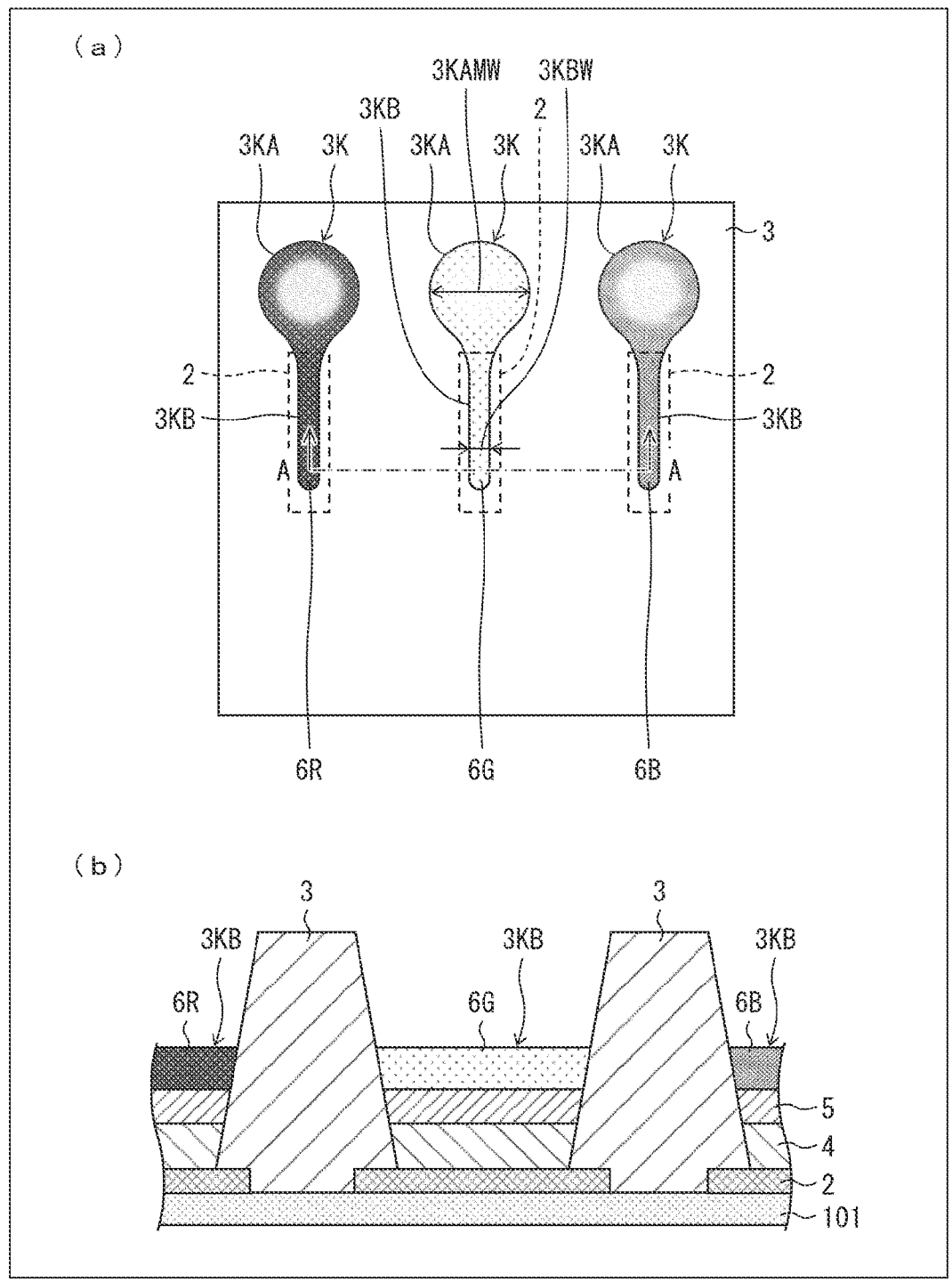

The following will describe embodiments of the present disclosure with reference to FIGS. 1 to 9. Throughout the following, members of an embodiment that have the same arrangement and function as members of a preceding embodiment are indicated by the same reference numerals and description thereof may be omitted for convenience of description.

Embodiment 1

Portion (a) of FIG. 1 is an illustration of a shape of openings 3K in a bank 3 in a display device 10 in accordance with Embodiment 1, and (b) of FIG. 1 is a cross-sectional view taken along line A-A in (a) of FIG. 1.

Figure 2:
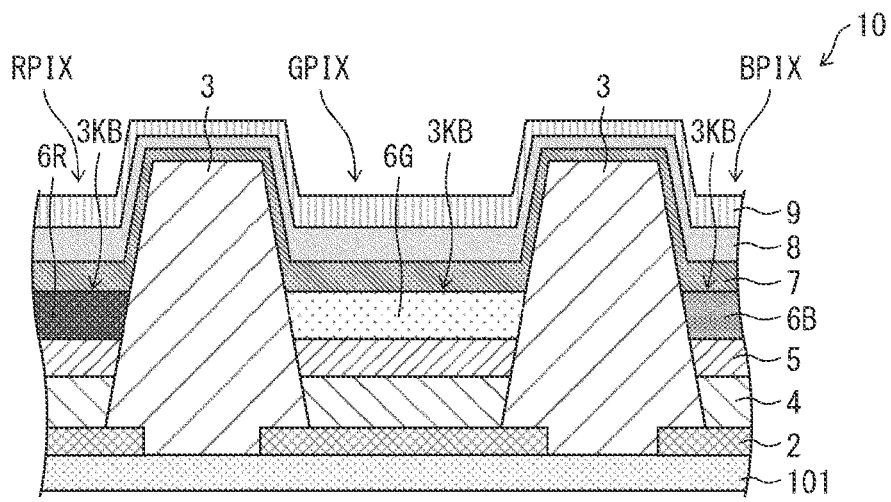
FIG. 2 is a schematic illustration of a structure of the display device in accordance with Embodiment 1.

FIG. 2 is a schematic illustration of a structure of the display device 10 in accordance with Embodiment 1.

As shown in (a) of FIG. 1, each opening 3K in the bank 3 in the display device 10 includes a first opening 3KA and a second opening 3KB. The second opening 3KB extends from the first opening 3KA in such a direction that the second opening 3KB overlaps a first electrode 2. The first opening 3KA and the second opening 3KB are contiguous and have no gap therebetween, to form the opening 3K. One of the ends of each first electrode 2 that is closer to the first opening 3KA underlies the second opening 3KB. The second opening 3KB has a maximum width 3KBW smaller than a maximum width 3KAMW of the first opening 3KA. These widths are measured perpendicular to the direction in which the second opening 3KB extends from the first opening 3KA (i.e., measured in the left/right direction in (a) of FIG. 1, which is perpendicular to the up/down direction in (a) of FIG. 1).

Portion (a) of FIG. 1 only shows one opening 3K for a R pixel, one opening 3K for a G pixel, and one opening 3K for a B pixel for simple description. There may be provided a plurality of openings 3K for a R pixel, a plurality of openings 3K for a G pixel, and a plurality of openings 3K for a B pixel in the banks 3 in the display device 10 in accordance with the resolution.

As shown in (a) and (b) of FIG. 1, for example, when a material is dispensed dropwise in the first opening 3KA in the opening 3K by inkjet printing or other like dispensation technology to form a functional layer such as a hole injection layer 4, a hole transport layer 5, or a light-emitting layer 6R, 6G, or 6B in the second opening 3KB in the opening 3K, the resultant functional layer is thicker along the periphery of the first opening 3KA than in the central part of the first opening 3KA because of the coffee ring effect. Since the maximum width 3KBW of the second opening 3KB is smaller the maximum width 3KAMW of the first opening 3KA, the functional layer is thicker in the second opening 3KB than in the central part of the first opening 3KA.

Each opening 3K in the bank 3 in the display device 10 includes the first opening 3KA, the periphery of the first opening 3KA, and the second opening 3KB. The first opening 3KA is provided for the purpose of ensuring room for the dropwise dispensation of a material for the functional layers. The resultant functional layer is thicker along the periphery of the first opening 3KA and in the second opening 3KB than in the central part of the first opening 3KA.

In the display device 10, the functional layer is thicker on the first electrode 2 than in the central part of the first opening 3KA. It is only the portion in which the first electrode 2 resides that serves as a light-emitting region in the display device 10. Accordingly, the central part of the first opening 3KA, which does not overlap the first electrode 2, is not a light-emitting region.

The present embodiment describes, as an example, the first electrode 2 as underlying the second opening 3KB at one of the ends thereof that is closer to the first opening 3KA as shown in (a) of FIG. 1. Alternatively, the first electrode 2 may underlie the periphery of the first opening 3KA at one of the ends thereof that is closer to the first opening 3KA, so long as the functional layer is thicker along the periphery of the first opening 3KA than in the central part of the first opening 3KA. The "periphery of the first opening 3KA" refers to a part of the first opening 3KA with a prescribed width where the functional layer is formed thicker than in the central part of the first opening 3KA as shown in (a) of FIG. 1.

As shown in (a) of FIG. 1, the first opening 3KA has a portion that appears circular in a plan view, and the second opening 3KB has a portion that appears rectangular in a plan view. The opening 3K in the bank 3 is accordingly shaped like a circle and a rectangle being joined together. The maximum width 3KBW of the second opening 3KB which includes a rectangular portion is smaller than the maximum width 3KAMW of the first opening 3KA which includes a circular portion. In the present embodiment, the maximum width 3KBW of the second opening 3KB is approximately 16 μm, and the maximum width 3KAMW of the first opening 3KA is approximately from 30 to 50 μm, as an example. The first opening 3KA where the functional layer material is dispensed dropwise is larger in size than the second opening 3KB, in order to ensure sufficient room for the functional layer material not to overflow from the opening 3K in consideration of, for example, variations in the location where the functional layer material is dispensed dropwise and variations in the quantity of the functional layer material dispensed. The functional layer material, when dispensed dropwise in the central part of the first opening 3KA, spreads to the periphery the first opening 3KA and also to the second opening 3KB. The solvent of the functional layer material is then dried out, which leaves the solute along the periphery of the first opening 3KA due to the coffee ring effect. The second opening 3KB is so narrow that the solute remains across the second opening 3KB.

The "coffee ring" develops, for example, by the following mechanism. If the light-emitting layers 6R, 6G, and 6B, which are functional layers, are to be formed of a QD colloidal solution such as QD ink or if the hole injection layer 4 or the hole transport layer 5, which are also functional layers, are to be formed of a colloidal solution, the solution is dispensed dropwise, and then the dispensed liquid drop is dried, which leaves a "coffee ring". The dispensed liquid drop is thinner along the circumference thereof than in the center where the liquid drop is dispensed. The liquid drop volatilizes quickly along the circumference. That generates a flow of the solution in the dispensed liquid drop from the center thereof toward the circumference thereof, thereby causing the colloid to collect along the circumference. The resultant film is hence thin in the center of the dispensed liquid drop, forming a coffee ring.

The present embodiment describes, as an example, the banks 3 as being formed of a positive photosensitive material through exposure and development. Alternatively, the banks 3 may be formed of a negative photosensitive material. In addition, the banks 3 are not necessarily made of a photosensitive material and may be formed by, for example, inkjet printing technology, so long as the banks 3 can be formed in a prescribed shape.

The present embodiment describes, as an example, the banks 3 as being made of a liquid-repelling material to impart water repellency to the banks 3 in consideration of the dispensed functional layer material. This is however not the only possible implementation of the present disclosure.

As shown in (b) of FIG. 1, an active matrix substrate 101 includes thereon a plurality of thin film transistors (TFTs) (not shown) as active elements. The active matrix substrate 101 further includes thereon a plurality of first electrodes 2 respectively connected electrically to, and driven by, the TFTs.

The bank 3 covers edges of the first electrodes 2, but leaves parts of the first electrodes 2 exposed in the openings 3K in the bank 3.

In the present embodiment, the hole injection layer 4, the hole transport layer 5, the light-emitting layer 6R, the light-emitting layer 6G, and the light-emitting layer 6B are formed sequentially by inkjet printing or other like dispensation technology using the bank 3. Any of the hole injection layer 4, the hole transport layer 5, the light-emitting layer 6R, the light-emitting layer 6G, and the light-emitting layer 6B is formed by a liquid drop dispensed in the central part of the first opening 3KA and spreading to the periphery of the first opening 3KA and to the second opening 3KB. The first electrode 2 has a thickness of approximately a few nanometers to 100 nm, and the liquid drop dispensed in the central part of the first opening 3KA has a thickness of approximately a few tens of micrometers. The liquid drop dispensed in the central part of the first opening 3KA therefore spreads to the second opening 3KB without being affected by steps formed due to the thickness of the first electrodes 2.

Besides the light-emitting layers 6R, 6G, and 6B, the hole injection layer 4 and the hole transport layer 5 are also formed by inkjet printing or other like dispensation technology in the present embodiment in order to maintain the water repellency of the banks 3 throughout the formation of the light-emitting layers 6R, 6G, and 6B. If the hole injection layer 4 and the hole transport layer 5 were formed across the surface by vapor deposition prior to the formation of the light-emitting layers 6R, 6G, and 6B, the water repellency of the banks 3 would not be maintained in the formation of the light-emitting layers 6R, 6G, and 6B.

Referring to FIG. 2, an electron transport layer 7, an electron injection layer 8, and second electrodes 9 are formed sequentially. A green pixel GPIX is an overlap of the first electrode 2, the hole injection layer 4, the hole transport layer 5, the light-emitting layer 6G, the electron transport layer 7, the electron injection layer 8, and the second electrode 9. A red pixel RPIX is an overlap of the first electrode 2, the hole injection layer 4, the hole transport layer 5, the light-emitting layer 6R, the electron transport layer 7, the electron injection layer 8, and the second electrode 9. A blue pixel BPIX is an overlap of the first electrode 2, the hole injection layer 4, the hole transport layer 5, the light-emitting layer 6B, the electron transport layer 7, the electron injection layer 8, and the second electrode 9. The present embodiment describes, as an example, the electron transport layer 7, the electron injection layer 8, and the second electrodes 9 as being formed across the surface by vapor deposition. Alternatively, the electron transport layer 7, the electron injection layer 8, and the second electrodes 9 may also be formed by inkjet printing or other like dispensation technology similarly to the hole injection layer 4, the hole transport layer 5, and the light-emitting layers 6R, 64 and 6B. The functional layers are not necessarily defined as in the foregoing description; the functional layers may, for example, not include the electron transport layer 7 and/or the hole transport layer 5.

The present embodiment describes, as an example, the first electrode 2 as serving as an anode and a second electrode 9 serving as a cathode. Alternatively, the first electrode 2 may be a cathode, and the second electrode 8 may be an anode. When the first electrode 2 is a cathode, and the second electrode 8 is an anode, there are provided, for example, an electron injection layer and an electron transport layer between the first electrodes 2 as cathodes and the light-emitting layers 6R, 6G, and 6B, and there are provided, for example, a hole transport layer and a hole injection layer between the second electrodes 8 as anodes and the light-emitting layers 6R, 6G, and 6B.

The present embodiment describes, as an example, the opening 3K in the bank 3 as including a single first opening 3KA and a single second opening 3KB as shown in (a) of FIG. 1. Alternatively, the opening 3K in the bank 3 may include one first opening 3KA and a plurality of second openings 3KB, in which case at least a part of each second opening 3KB overlaps an associated one of the first electrodes 2.

The present embodiment describes, as an example, the hole injection layer 4, the hole transport layer 5, the light-emitting layer 6R, the light-emitting layer 6G, and the light-emitting layer 6B as being formed of respective functional layer materials having an approximate solution-to-solute volume ratio of, for example, 100. This is however not the only possible implementation of the present disclosure.

The display device 10, in which the functional layers such as the light-emitting layers 6R, 6G, and 6B, the hole injection layer 4, and the hole transport layer 5 are formed by dispensation, can ensure a sufficient thickness for these functional layers in the portions serving as light-emitting regions. The display device 10 can therefore prevent short-circuiting and related defects, thereby preventing light emission defects.

The present embodiment describes, as an example, the hole injection layer 4, the hole transport layer 5, and the light-emitting layers 6R, 6G, and 6B as being formed by inkjet printing or other like dispensation technology and the electron transport layer 7, the electron injection layer 8, and the second electrodes 9 as being formed by vapor deposition. Alternatively, it may be only the light-emitting layers 6R, 6G, and 6B that are formed by inkjet printing or other like dispensation technology.

Figure 3:
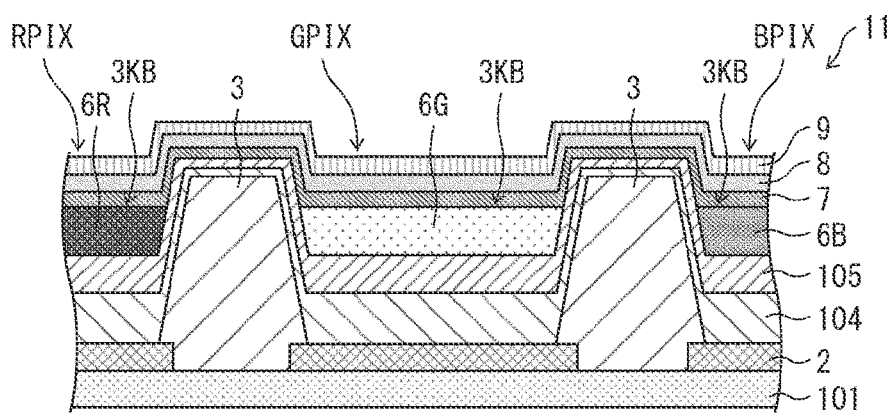
FIG. 3 is a schematic illustration of a structure of a display device in accordance with a variation example of Embodiment 1.

FIG. 3 is a schematic illustration of a structure of a display device 11.

In the display device 11, only the light-emitting layers 6R, 6G, and 6B are formed by inkjet printing or other like dispensation technology. A hole injection layer 104, a hole transport layer 105, the electron transport layer 7, the electron injection layer 8, and the second electrodes 9 are formed by vapor deposition.

The display device 11, in which only the light-emitting layers 6R, 6G, and 6B are formed by dispensation, can ensure a sufficient thickness for the light-emitting layers 6R, 6G, and 6B in the portions serving as light-emitting regions. The display device 11 can therefore prevent short-circuiting and related defects, thereby preventing light emission defects.

Embodiment 2

Figure 4:
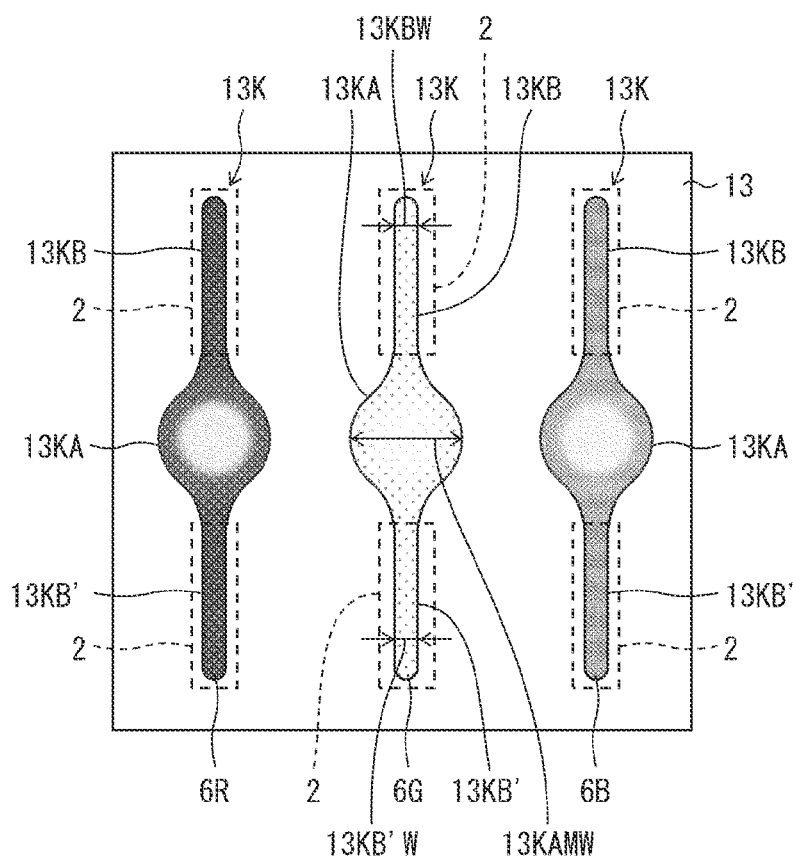
FIG. 4 is an illustration of a shape of openings in a bank in a display device in accordance with Embodiment 2.
Figure 5:
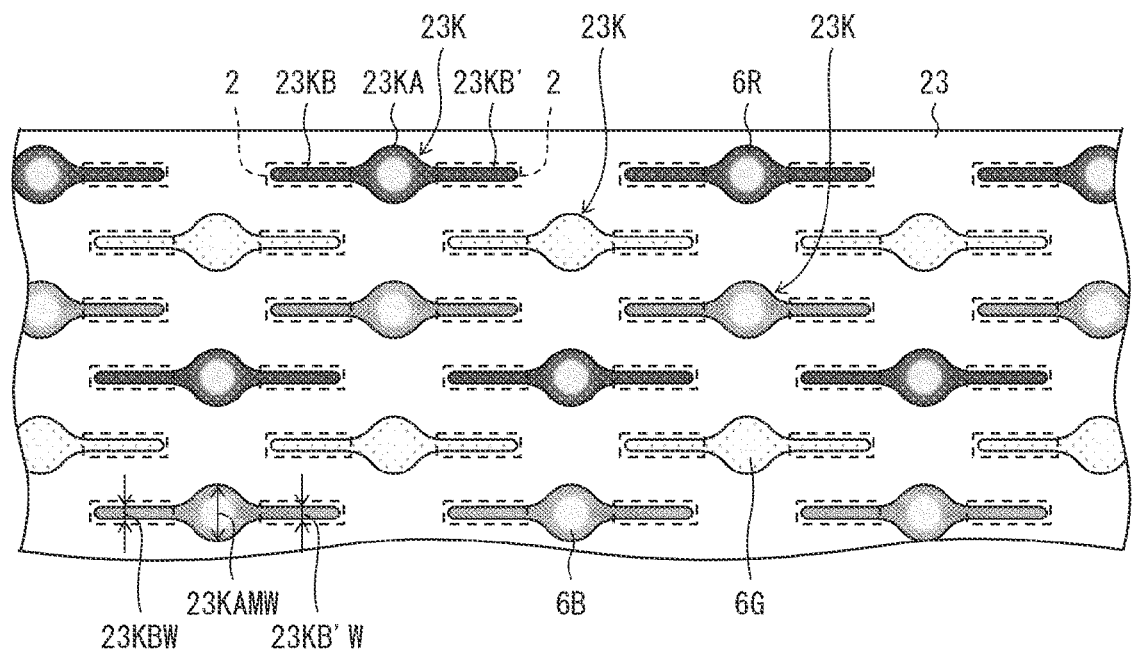
FIG. 5 is an illustration of a shape of openings in a bank in a display device in accordance with a variation example of Embodiment 2.

A description is now given of Embodiment 2 of the present invention with reference to FIGS. 4 and 5. A display device in accordance with the present embodiment differs from Embodiment 1 in that the display device has openings 13K and 23K in banks 13 and 23 respectively, that the openings 13K and 23K each include a plurality of second openings 13KB and 13KB' and a plurality of second openings 23KB and 23KB' respectively, and that the second openings 13KB, 13KB', 23KB, and 23KB' at least partially overlap first electrodes 2 of different pixels. The display device is otherwise the same as Embodiment 1. For convenience of description, members of the present embodiment that have the same function as members shown in the drawings for Embodiment 1 above are indicated by the same reference numerals, and description thereof is omitted.

FIG. 4 is an illustration of a shape of the openings 13K in the bank 13 in the display device in accordance with Embodiment 2.

Referring to FIG. 4, each opening 13K in the bank 13 includes one first opening 13KA and two second openings 13KB and 13KB'. The second opening 13KB and the second opening 13KB' extend in opposite directions from the first opening 13KA. The second openings 13KB and 13KB' at least partially overlap the first electrodes 2 of different pixels.

The first opening 13KA in the opening 13K in the bank 13 resides between pixels that are adjacent in the up/down direction in FIG. 4, in other words, resides between those first electrodes 2 that are adjacent in the up/down direction in FIG. 4. The second opening 13KB in the opening 13K in the bank 13 at least partially overlaps one of the first electrodes 2 that resides near the upper end of FIG. 4, whereas the second opening 13KB' in the opening 13K in the bank 13 at least partially overlaps one of the first electrodes 2 that resides near the lower end of FIG. 4.

Referring to FIG. 4, the first opening 13KA has a portion that appears circular in a plan view, and the second openings 13KB and 13KB' each have a portion that appears rectangular in a plan view. The opening 13K in the bank 13 is accordingly shaped like a circle and rectangles being joined together. One of the ends of each first electrode 2 that is closer to the first opening 13KA underlies either one of the second openings 13KB and 13KB'. The second opening 13KB has maximum widths 13KBW and 13KB'W smaller than a maximum width 13KAMW of the first opening 13KA. These widths are measured perpendicular to the direction in which the second openings 13KB and 13KB' extend from the first opening 13KA (i.e., measured in the left/right direction in FIG. 4, which is perpendicular to the up/down direction in FIG. 4). The second opening 13KB has a rectangular portion, and the first opening 13KA has a circular portion. In the present embodiment, the maximum widths 13KBW and 13KB'W of the second openings 13KB and 13KB' are approximately 16 μm, and the maximum width 13KAMW of the first opening 13KA is approximately from 30 to 50 μm, as an example.

The present embodiment describes, as an example, the first opening 13KA in the opening 13K in the bank 13 as residing between pixels that are adjacent in the up/down direction in FIG. 4, in other words, residing between those first electrodes 2 that are adjacent in the up/down direction in FIG. 4, the second opening 13KB in the opening 13K in the bank 13 as at least partially overlapping one of the first electrodes 2 that resides near the upper end of FIG. 4, and the second opening 13KB' in the opening 13K in the bank 13 as at least partially overlapping one of the first electrodes 2 that resides near the lower end of FIG. 4. Alternatively, for instance, the first opening 13KA in the opening 13K in the bank 13 may reside between pixels that are adjacent in the left/right direction in FIG. 4, in other words, may reside between those first electrodes 2 that are adjacent in the left/right direction in FIG. 4, the second opening 13KB in the opening 13K in the bank 13 may at least partially overlap one of the first electrodes 2 that resides near the left side of FIG. 4, and the second opening 13KB' in the opening 13K in the bank 13 may at least partially overlap one of the first electrodes 2 that resides near the right side of FIG. 4.

The present embodiment describes, as an example, the hole injection layer 4, the hole transport layer 5, and the light-emitting layers 6R, 6G, and 6B as being formed by inkjet printing or other like dispensation technology and the electron transport layer 7, the electron injection layer 8, and the second electrodes 9 as being formed by vapor deposition. Alternatively, it may be only the light-emitting layers 6R, 6G, and 6B that are formed by inkjet printing or other like dispensation technology.

The display device including the banks 13, in which the functional layers such as the light-emitting layers 6R, 6G, and 6B, the hole injection layer 4, and the hole transport layer 5 are formed by dispensation, can ensure a sufficient thickness for these functional layers in the portions serving as light-emitting regions. The display device can therefore prevent short-circuiting and related defects, thereby preventing light emission defects.

FIG. 5 is an illustration of a shape of the openings 23K in the bank 23 in a display device in accordance with a variation example of Embodiment 2.

A first opening 23KA in the opening 23K in the bank 23 resides between pixels that are adjacent in the left/right direction in FIG. 5, in other words, resides between those first electrodes 2 that are adjacent in the left/right direction in FIG. 5. The second opening 23KB in the opening 23K in the bank 23 at least partially overlaps the left-hand first electrode 2 in FIG. 5. The second opening 23KB' in the opening 23K in the bank 23 at least partially overlaps the right-hand first electrode 2 FIG. 5. This particular structure is similar to that of the opening 13K in the bank 13 shown in FIG. 4. There are however differences as in the following.

Referring to FIG. 5, each first opening 23KA in the opening 23K in the bank 23 is separated from the adjacent first opening 23KA by a prescribed distance not only in the left/right direction in FIG. 5, but also in the up/down direction in FIG. 5. The centers of the first openings 23KA that are provided in the openings 23K in the bank 23 and that are adjacent in the left/right direction in FIG. 5 are separated from each other by at least a distance that is equal to a sum of the left/right size of two pixels in the figure and the left/right distance between the two pixels in the figure. The centers of the first openings 23KA that are provided in the openings 23K in the bank 23 and that are adjacent in the up/down direction in FIG. 5 are separated from each other by at least a distance that is equal to a sum of the up/down size of a single pixel in the figure and double the up/down distance between adjacent pixels in the figure.

Referring to FIG. 5, the first opening 23KA has a portion that appears circular in a plan view, and the second openings 23KB and 23KB' each have a portion that appears rectangular in a plan view. The opening 23K in the bank 23 is accordingly shaped like a circle and rectangles being joined together. Each first electrode 2 underlies either one of the second openings 23KB and 23KB' at one of the ends thereof that is closer to the first opening 23KA. The second opening 23KB has maximum widths 23KBW and 23KB'W smaller than a maximum width 23KAMW of the first opening 23KA. These widths are measured perpendicular to the direction in which the second openings 23KB and 23KB' extend from the first opening 23KA (i.e., measured in the up/down direction in FIG. 5, which is perpendicular to the left/right direction in FIG. 5). The second opening 23KB has a rectangular portion, and the first opening 23KA has a circular portion. In the present embodiment, the maximum widths 23KBW and 23KB'W of the second openings 23KB and 23KB' are approximately 16 μm, and the maximum width 23KAMW of the first opening 23KA is approximately from 30 to 50 μm, as an example.

The display device including the banks 23, in which the functional layers such as the light-emitting layers 6R, 6G, and 6B, the hole injection layer 4, and the hole transport layer 5 are formed by dispensation, can ensure a sufficient thickness for these functional layers in the portions serving as light-emitting regions. The display device can therefore prevent short-circuiting and related defects, thereby preventing light emission defects.

Embodiment 3

Figure 6:
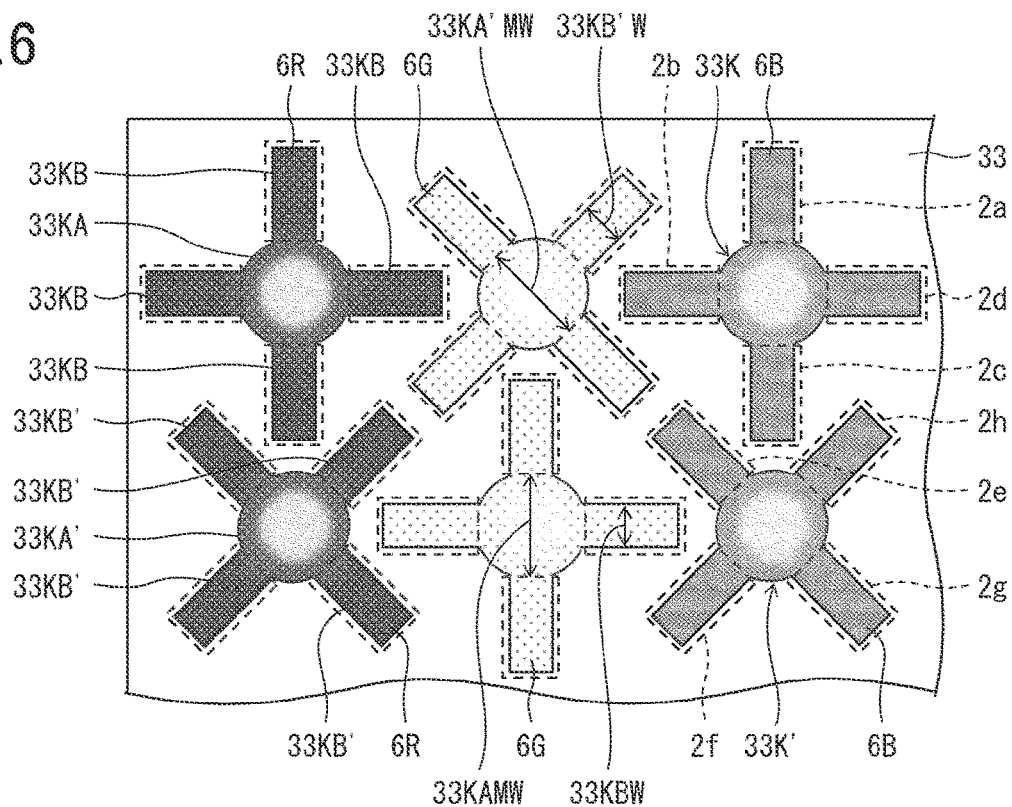
FIG. 6 is an illustration of a shape of openings in a bank in a display device in accordance with Embodiment 3.

A description is now given of Embodiment 3 of the present invention with reference to FIG. 6. A display device in accordance with the present embodiment differs from Embodiments 1 and 2 in that the display device has a bank 33 in which openings 33K and 33K' having adjacent first openings 33KA and 33KA' include second openings 33KB and second openings 33KB' respectively, the second openings 33KB extending from the first opening 33KA in a different direction than the second openings 33KB' extending from the rust opening 33KA'. The display device is otherwise the same as Embodiments 1 and 2. For convenience of description, members of the present embodiment that have the same function as members shown in the drawings for Embodiments 1 and 2 above are indicated by the same reference numerals, and description thereof is omitted.

FIG. 6 is an illustration of a shape of the openings 33K and 33K' in the bank 33 in the display device in accordance with Embodiment 3.

As shown in FIG. 6, the two openings 33K and 33K' having the adjacent first openings 33KA and 33KA' respectively in the bank 33 include the second openings 33KB and the second openings 33KB' respectively, the second openings 33KB extending from the first opening 33KA in a different direction than the second openings 33KB' extending from the first opening 33KA'. In other words, of the four second openings 33KB in the openings 33K, the second opening 33KB overlapping a first electrode 2a extends upwards from the first opening 33KA in FIG. 6, the second opening 33KB overlapping a first electrode 2c extends downwards from the first opening 33KA in FIG. 6, the second opening 33KB overlapping a first electrode 2b extends leftwards from the first opening 33KA in FIG. 6, and the second opening 33KB overlapping a first electrode 2d extends rightwards from the first opening 33KA in FIG. 6. In contrast, of the four second openings 33KB' in the opening 33K', the second opening 33KB' overlapping a first electrode 2e extends upwards to the left from the first opening 33KA' in FIG. 6, the second opening 33KB' overlapping a first electrode 2f extends downwards to the left from the first opening 33KA' in FIG. 6, the second opening 33KB' overlapping a first electrode 2g extends downwards to the right from the first opening 33KA' in FIG. 6, and the second opening 33KB' overlapping a first electrode 2h extends upwards to the right from the first opening 33KA' in FIG. 6.

Referring to FIG. 6, the first openings 33KA and 33KA' each have a portion that appears circular in a plan view, and the second openings 33KB and 33KB' each have a portion that appears rectangular in a plan view. The openings 33K and 33K' in the bank 33 are accordingly shaped like a circle and rectangles being joined together. One of the ends of each first electrode 2a to 2h that is closer to the first opening 33KA, 33KA' underlies either one of the second openings 33KB and 33KB'. The second openings 33KB and 33KB' have maximum widths 33KBW and 33KB'W smaller than maximum widths 33KAMW and 33KA'MW of the first openings 33KA and 33KA' respectively. These widths are measured perpendicular to the direction in which the second openings 33KB and 33KB' extend from the first openings 33KA and 33KA' respectively. The second openings 33KB and 33KB' each have a rectangular portion, and the first openings 33KA and 33KA' each have a circular portion. In the present embodiment, the maximum widths 33KBW and 33KB'W of the second openings 33KB and 33KB' are approximately 16 μm, and the maximum widths 33KAMW and 33KA' MW of the first openings 33KA and 33KA' are approximately from 30 to 50 μm, as an example.

The display device including the banks 33, in which the functional layers such as the light-emitting layers 6R, 6G, and 6B, the hole injection layer 4, and the hole transport layer 5 are formed by dispensation, can ensure a sufficient thickness for these functional layers in the portions serving as light-emitting regions. The display device can therefore prevent short-circuiting and related defects, thereby preventing light emission defects.

Embodiment 4

Figure 7:
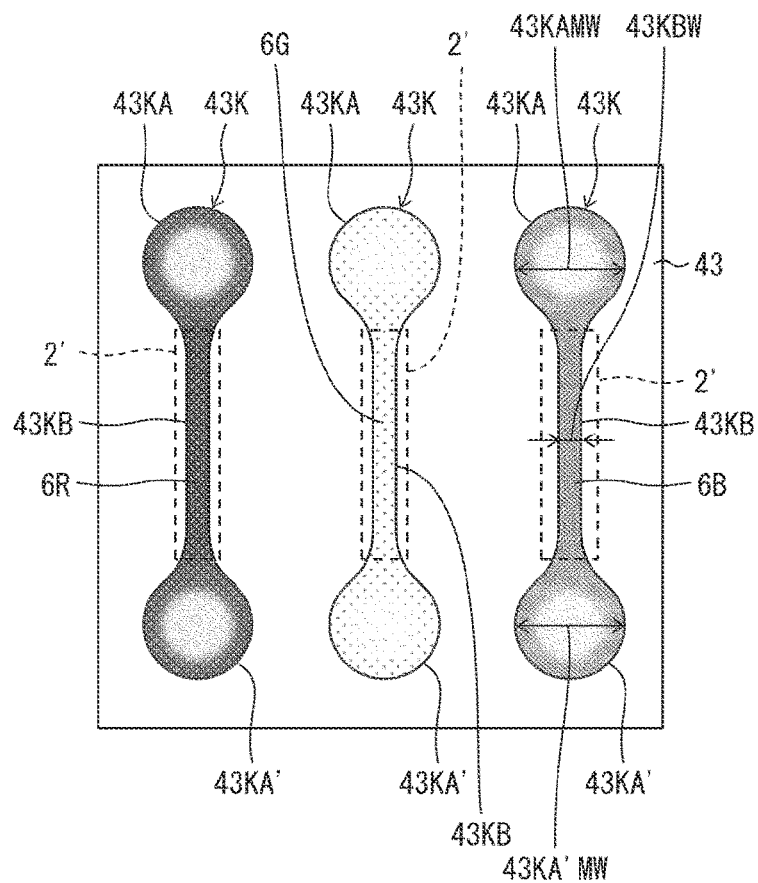
FIG. 7 is an illustration of a shape of openings in a bank in a display device in accordance with Embodiment 4.

A description is now given of Embodiment 4 of the present invention with reference to FIG. 7. A display device in accordance with the present embodiment differs from Embodiments 1 to 3 in that the display device has, in banks 43, openings 43K each including a plurality of first openings 43KA and 43KA' and a single second opening 43KB. The display device is otherwise the same as Embodiments 1 to 3.

For convenience of description, members of the present embodiment that have the same function as members shown in the drawings for Embodiments 1 to 3 above are indicated by the same reference numerals, and description thereof is omitted.

FIG. 7 is an illustration of a shape of the openings 43K in the bank 43 in the display device in accordance with Embodiment 4.

As shown in FIG. 7, each opening 43K in the bank 43 includes the two first openings 43KA and 43KA' and the single second opening 43KB. The single second opening 43KB extends from both the two first openings 43KA and 43KA' in such a direction that the second opening 43KB overlaps the first electrode 2' (the up/down direction in FIG. 7).

The first electrode 2' has a different shape than the first electrode 2 in accordance with Embodiments 1 to 3 in that the first electrode 2' is elongated in a direction when compared with the first electrode 2. In the present embodiment, this direction is the up/down direction in FIG. 7 in which the second opening 43KB extends from the two first openings 43KA and 43KA'.

The second opening 43KB, provided on the first electrode 2' elongated in the up/down direction in FIG. 7, is also elongated in the up/down direction in FIG. 7 as described here. The provision of the two first openings 43KA and 43KA' for the single second opening 43KB therefore enables the functional layers such as the light-emitting layers 6R, 6G, and 6B, the hole injection layer 4, and the hole transport layer 5 to be formed by dispensation in the second opening 43KB elongated in the up/down direction in FIG. 7.

Referring to FIG. 7, the first openings 43KA and 43KA' each have a portion that appears circular in a plan view, and the second opening 43KB has a portion that appears rectangular in a plan view. The opening 43K in the bank 43 is accordingly shaped like circles and a rectangle being joined together. One of the ends of each first electrode 2' that is closer to the first opening 43KA, 43KA' underlies the second opening 43KB. The second opening 43KB has a maximum width 43KBW smaller than maximum widths 43KAMW and 43KA'MW of the first openings 43KA and 43KA' respectively. These widths are measured perpendicular to the direction in which the second opening 43KB extends from the first openings 43KA and 43KA'. The second opening 43KB has a rectangular portion, and the first openings 43KA and 43KA each have a circular portion. In the present embodiment, the maximum width 43KBW of the second opening 43KB is approximately 16 μm, and the maximum widths 43KAMW and 43KA'MW of the first openings 43KA and 43KA' are approximately from 30 to 50 μm as an example.

The display device including the banks 43, in which the functional layers such as the light-emitting layers 6R, 6G, and 6B, the hole injection layer 4, and the hole transport layer 5 are formed by dispensation, can ensure a sufficient thickness for these functional layers in the portions serving as light-emitting regions. The display device can therefore prevent short-circuiting and related defects, thereby preventing light emission defects.

Embodiment 5

Figure 8:
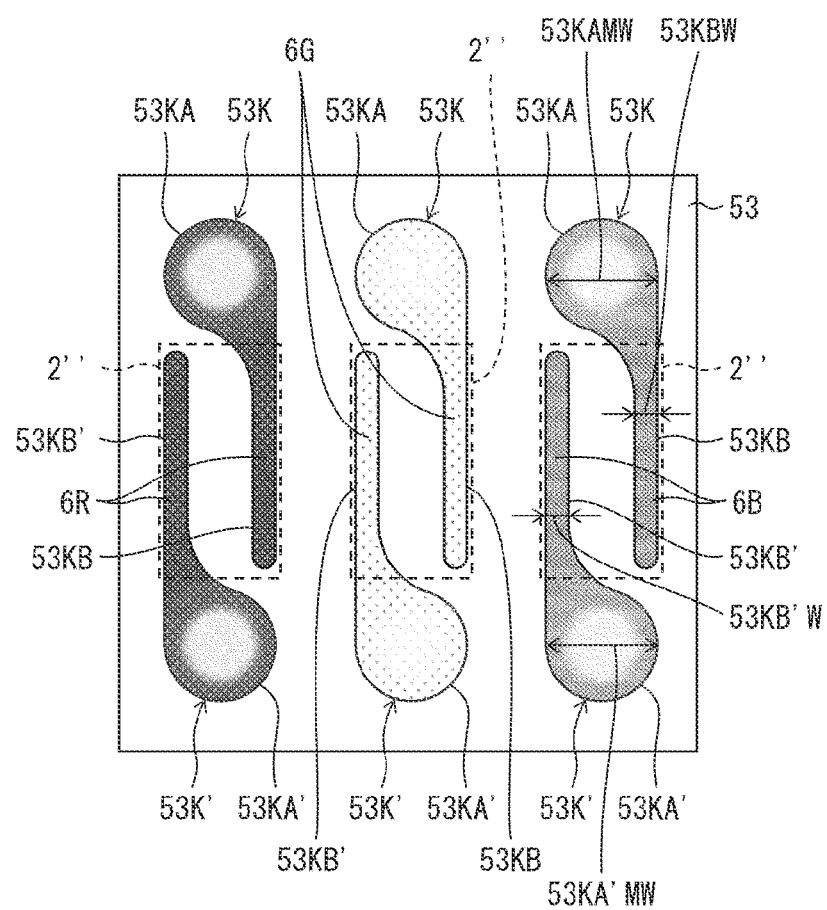
FIG. 8 is an illustration of a shape of openings in a bank in a display device in accordance with Embodiment 5.

A description is now given of Embodiment 5 of the present invention with reference to FIG. 8. A display device in accordance with the present embodiment differs from Embodiments 1 to 4 in that the display device includes, in banks 53, a plurality of openings 53K and 53K' having respective second openings 53KB and 53KB' each at least partially overlapping a first electrode 2". The display device is otherwise the same as Embodiments 1 to 4. For convenience of description, members of the present embodiment that have the same function as members shown in the drawings for Embodiments 1 to 4 above are indicated by the same reference numerals, and description thereof is omitted.

FIG. 8 is an illustration of a shape of the openings 53K and 53K' in the bank 53 in the display device in accordance with Embodiment 5.

As shown in FIG. 8, the opening 53K includes the second opening 53KB overlapping the first electrode 2" and extending from a first opening 53KA, and the opening 53K' includes the second opening 53KB' overlapping the first electrode 2" and extending from a first opening 53KA'. The second openings 53KB and 53KB', in the openings 53K and 53K' respectively, at least partially overlap the first electrode 2".

Referring to FIG. 8, the first openings 53KA and 53KA each have a portion that appears circular in a plan view, and the second openings 53KB and 53KB' each have a portion that appear rectangular in a plan view. The openings 53K and 53K' in the bank 53 are accordingly shaped like a circle and a rectangle being joined together. One of the ends of each first electrode 2" that is closer to the first opening 53KA, 53KA' underlies either one of the second openings 53KB and 53KB'. The second openings 53KB and 53KB' have maximum widths 53KBW and 53KB'W smaller than maximum widths 53KAMW and 53KA'MW of the first openings 53KA and 53KA' respectively. These widths are measured perpendicular to the direction in which the second openings 53KB and 53KB' extend from the first openings 53KA and 53KA' respectively. The second openings 53KB and 53KB' each have a rectangular portion, and the first openings 53KA and 53KA' each have a circular portion. In the present embodiment, the maximum widths 53KBW and 53KB'W of the second openings 53KB and 53KB' are approximately 16 μm, and the maximum widths 53KAMW and 53KA'MW of the first openings 53KA and 53KA' are approximately from 30 to 50 μm, as an example.

In this particular structure, the second openings 53KB and 53KB', in the two openings 53K and 53K' respectively, at least partially overlap the first electrode 2". The structure hence can ensure large light-emitting regions even when the maximum widths 53KBW and 53KB'W of the second openings 53KB and 53KB' are small.

The display device including the banks 53, in which the functional layers such as the light-emitting layers 6R, 6G, and 6B, the hole injection layer 4, and the hole transport layer 5 are formed by dispensation, can ensure a sufficient thickness for these functional layers in the portions serving as light-emitting regions. The display device can therefore prevent short-circuiting and related defects, thereby preventing light emission defects.

Embodiment 6

Figure 9:
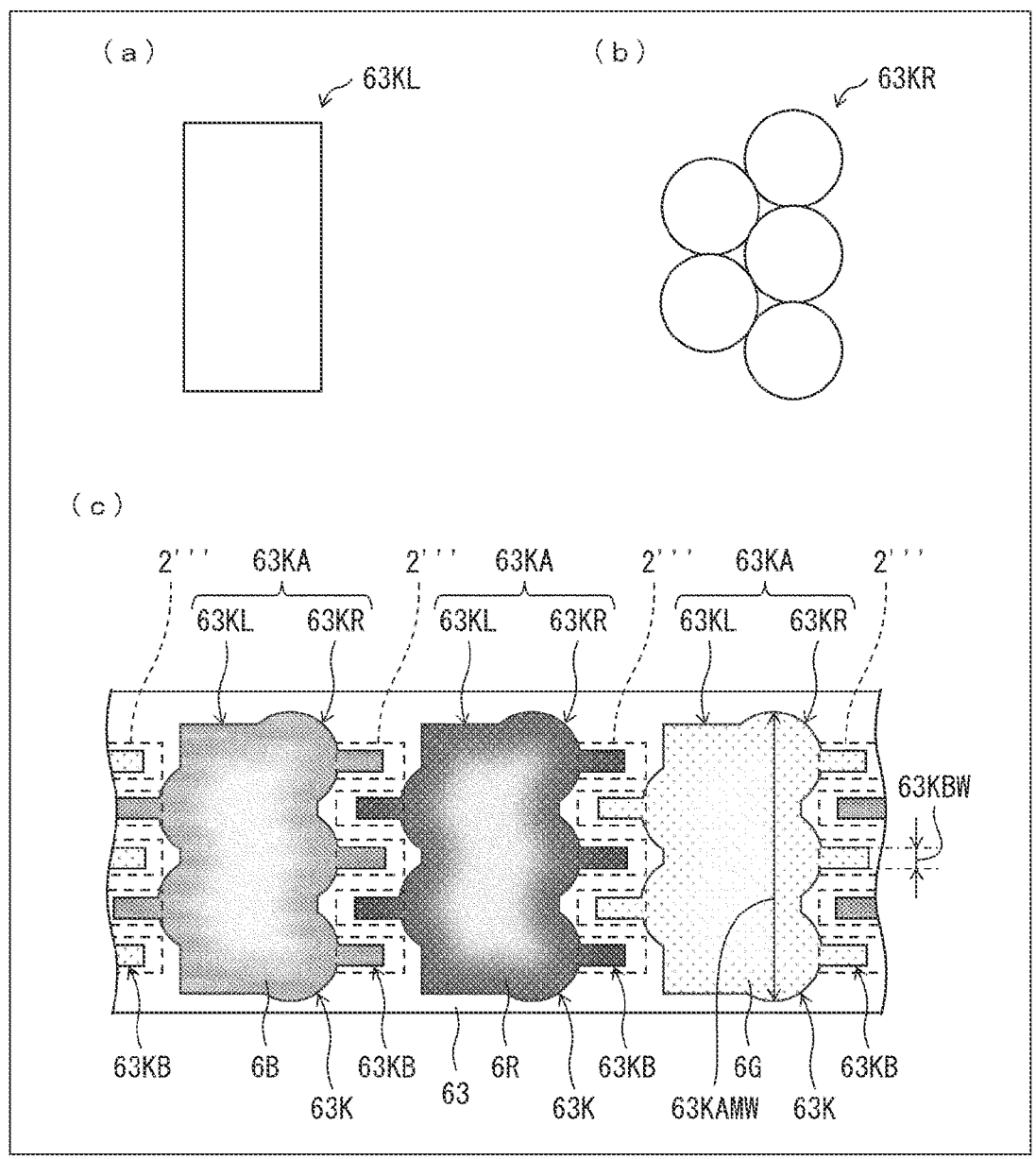
FIG. 9 is a set of illustrations of a shape of openings in a bank in a display device in accordance with Embodiment 6.
Figure 10:
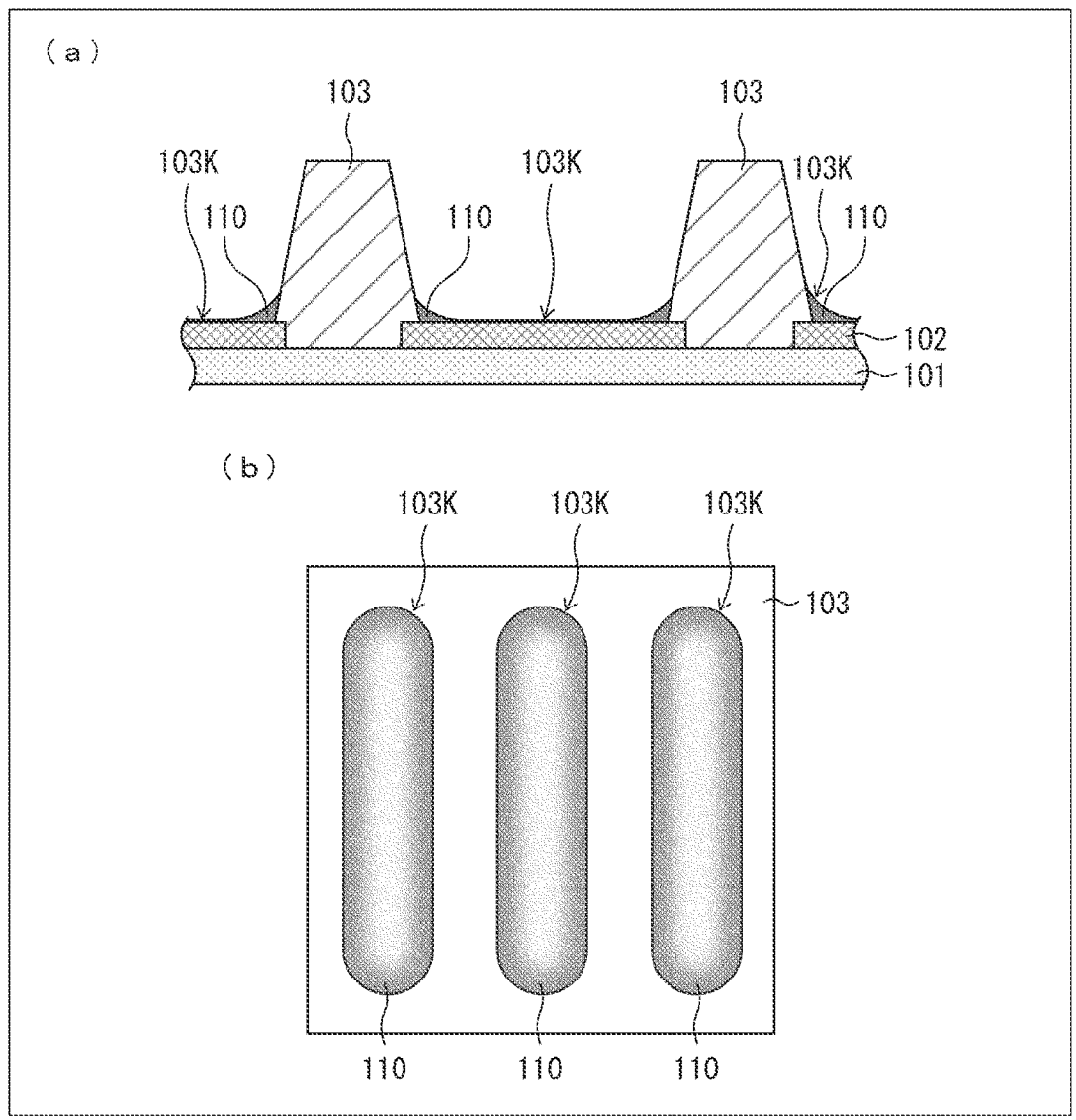
FIG. 10 is a set of illustrations of problems that can occur when a functional layer such as a light-emitting layer, a hole transport layer, or a hole injection layer is formed by dispensation using conventional banks.

A description is now given of Embodiment 6 of the present invention with reference to FIG. 9. A display device in accordance with the present embodiment differs from Embodiments 1 to 5 in that the display device has, in banks 63, openings 63K each having a first opening 63KA and second openings 63KB, the first opening 63KA including a linear portion 63KL extending perpendicular to the direction in which the second openings 63KB extends from the first opening 63KA. The display device is otherwise the same as Embodiments 1 to 5. For convenience of description, members of the present embodiment that have the same function as members shown in the drawings for Embodiments 1 to 5 above are indicated by the same reference numerals, and description thereof is omitted.

FIG. 9 is a set of illustrations of a shape of the opening 63K in the bank 63 in the display device in accordance with Embodiment 6.

Portion (a) of FIG. 9 is an illustration of the linear portion 63KL of the first opening 63KA in the opening 63K in the bank 63. Portion (b) of FIG. 9 is an illustration a circular portion 63KR of the first opening 63KA in the opening 63K in the bank 63. Portion (c) of FIG. 9 is an illustration of a shape of the opening 63K including the first opening 63KA and the second openings 63KB in the bank 63. The first opening 63KA is a superimposition of the linear portion 63KL of the first opening 63KA shown in (a) of FIG. 9 and the circular portion 63KR of the first opening 63KA shown in (b) of FIG. 9.

Referring to FIG. 9, the first opening 63KA includes the linear portion 63KL and the circular portion 63KR in a plan view, and the second opening 63KB includes a portion that appears rectangular in a plan view. The opening 63K in the bank 63 is accordingly shaped like circles and a rectangle being joined together. One of the ends of each first electrode 2''' that is closer to the first opening 63KA, 63KA' overlaps one of the second openings 63KB. The second opening 63KB has a maximum width 63KBW smaller than a maximum width 63KAMW of the first opening 63KA. These widths are measured perpendicular to the direction in which the second opening 63KB extends from the first opening 63KA. In the present embodiment, the maximum width 63KBW of the second opening 63KB is approximately 16 μm, and the maximum width 63KAMW of the first opening 63KA is approximately 90 to 150 μm, as an example.

Some of the second openings 63KB in the opening 63K extend in a direction from the first opening 63KB, and the other second openings 63KB extend in an opposite direction. More specifically, some of the second openings 63KB extend leftwards in (b) of FIG. 9, and the other second openings 63KB extend rightwards in (b) of FIG. 9.

The display device including the banks 63, in which the functional layers such as the light-emitting layers 6R, 6G, and 6B, the hole injection layer 4, and the hole transport layer 5 are formed by dispensation, can ensure a sufficient thickness for these functional layers in the portions serving as light-emitting regions. The display device can therefore prevent short-circuiting and related defects, thereby preventing light emission defects.

FIG. 9 shows each first opening 63KA corresponding to five second openings 63KB, in other words, corresponding to five subpixels (first electrodes 2'''). Alternatively, each rust opening 63KA may correspond to one to four or six or more second openings 63KB. As another alternative, a single first opening 63KA may be provided from an end of a display area to the other end of the display area. These particular structures allow for the successive formation of the functional layers by inkjet printing technology. The structures can prevent misdirection in ejection and reduce variations in ejection volume, thereby enabling formation of uniform functional layers, and can also prevent ejection toward an adjacent sub-picture element.

General Description

Aspect 1

A display device including: a pixel including: a first electrode; a second electrode; and a light-emitting layer between the first and second electrodes; and a bank covering a part of the first electrode, wherein the bank has an opening including a first opening and a second opening extending from the first opening in such a direction that the second opening overlaps the first electrode, the second opening at least partially overlaps the first electrode, the first electrode has an end located close to the first opening and overlapping either the second opening or a periphery of the first opening, and the second opening has a maximum width smaller than a maximum width of the first opening, the widths being measured perpendicular to a direction in which the second opening extends from the first opening.

Aspect 2

The display device of aspect 1, wherein The first electrode is an anode, the display device further including a hole transport layer between the anode and the light-emitting layer.

Aspect 3

The display device of aspect 2, the display device further including a hole injection layer between the anode and the hole transport layer.

Aspect 4

The display device of any one of aspects 1 to 3, wherein the second electrode is a cathode, the display device further including an electron transport layer between the cathode and the light-emitting layer.

Aspect 5

The display device of aspect 4, the display device further including an electron injection layer between the cathode and the electron transport layer.

Aspect 6

The display device of any one of aspects 1 to 5, wherein the opening includes a plurality of the second openings.

Aspect 7

The display device of any one of aspects 1 to 5, the display device including a plurality of the pixels, wherein the opening includes a plurality of the second openings, and each second opening at least partially overlaps the first electrode of a different one of the pixels.

Aspect 8

The display device of aspect 7, wherein the first opening includes a linear portion extending in a direction perpendicular to a direction in which the second openings extend from the first opening.

Aspect 9

The display device of aspect 7 or 8, wherein some of the second openings extend from the first opening in a direction, and the other second openings extend from the first opening in an opposite direction.

Aspect 10

The display device of aspect 8, the display device including a plurality of the openings, wherein in those two openings of which the first openings are adjacent to each other, the second opening of one of the two openings extends from the first opening in a different direction than the second opening of the other opening extends from the first opening.

Aspect 11

The display device of any one of aspects 1 to 5, wherein the opening includes a plurality of the first openings and the single second opening, and the single second opening extends from the first openings in such a direction that the single second opening overlaps the first electrode.

Aspect 12

The display device of any one of aspects 1 to 5, the display device including a plurality of the openings, wherein in each opening, the second opening at least partially overlaps the first electrode.

Aspect 13

The display device of any one of aspects 1 to 7, and 10 to 12, wherein the first opening includes a portion that appears circular in a plan view, and the second opening includes a portion that appears rectangular in a plan view.

Aspect 14

The display device of any one of aspects 1 to 13, wherein the bank is made of a liquid-repelling material.

Aspect 15

The display device of any one of aspects 1 to 14, the display device further including a functional layer including at least the light-emitting layer in the first opening and the second opening, wherein the functional layer has a larger thickness in the second opening than in a central part of the first opening.

Aspect 16

A method of manufacturing a display device, the method including: forming a first electrode; forming a bank covering a pail of the first electrode; and forming a functional layer including at least a light-emitting layer, wherein in the forming of the bank covering a part of the first electrode, an opening including a first opening and a second opening is formed in the bank, the second opening extending from the first opening in such a direction that the second opening overlaps the first electrode, and in the forming of the functional layer including at least a light-emitting layer, a material for the functional layer is dispensed dropwise in the first opening to form the functional layer in the second opening.

Additional Remarks

The present disclosure is not limited to the description of the embodiments above and may be altered within the scope of the claims. Embodiments based on a proper combination of technical means disclosed in different embodiments are encompassed in the technical scope of the present. Furthermore, new technological features can be created by combining different technical means disclosed in the embodiments.

INDUSTRIAL APPLICABILITY

The present disclosure is applicable to display devices and methods of manufacturing display devices.

REFERENCE SIGNS LIST

2 First Electrode
2a to 2h First Electrode
2', 2", 2'" First Electrode
3, 13, 23, 33, 43, 53, 63 Bank
3K, 13K, 23K, 33K, 43K, 53K, 63K Opening
33K', 53K' Opening
3KA, 13KA, 23KA, 33KA, 43KA, 53KA, 63KA First Opening
33KA', 53KA' First Opening
3KB, 13KB, 23KB, 33KB, 43KB, 53KB, 63KB Second Opening
13KB', 23KB', 33KB', 53KB' Second Opening
63KL Linear Portion of First Opening
63KR Circular Portion of First Opening
4 Hole Injection Layer (Functional Layer)
5 Hole Transport Layer (Functional Layer)
6R, 6G, 6B Light-emitting Layer (Functional Layer)
7 Electron Transport Layer
8 Electron Injection Layer
9 Second Electrode (Cathode)
RPIX, GPIX, BPIX Pixel
10, 11 Display Device
3KAMW, 13KAMW, 23KAMW Maximum Width of First Opening
33KA'MW, 33KAMW Maximum Width of First Opening
43KAMW, 43KA'MW Maximum Width of First Opening
53KAMW, 53KA'MW Maximum Width of First Opening
63KAMW Maximum Width of First Opening
3KBW, 13KBW, 13KB'W Maximum Width of Second Opening
23KBW, 23KB'W Maximum Width of Second Opening
33KBW, 33KB'W Maximum Width of Second Opening
43KBW Maximum Width of Second Opening
53KBW, 53KB'W Maximum Width of Second Opening
63KBW Maximum Width of Second Opening

The invention claimed is:

1. A display device comprising:
a pixel including:
   a first electrode;
   a second electrode; and
   a light-emitting layer between the first and second electrodes;
a bank covering a part of the first electrode;
a hole transport layer; and
a functional layer, wherein
the bank has an opening including a first opening and a second opening extending from the first opening in such a direction that the second opening overlaps the first electrode,
the second opening at least partially overlaps the first electrode,
the first electrode has an end located close to the first opening and overlapping either the second opening or a periphery of the first opening,
the second opening has a maximum width smaller than a maximum width of the first opening, the maximum widths of the first and second openings being measured perpendicular to a direction in which the second opening extends from the first opening,
the first electrode is an anode,
the hole transport layer is between the anode and the light-emitting layer, and
the functional layer includes at least the light-emitting layer in the first opening and the second opening, and has a larger thickness in the second opening than in the first opening.

2. The display device according to claim 1, further comprising a hole injection layer between the anode and the hole transport layer.

3. The display device according to claim 1, wherein the second electrode is a cathode,
the display device further comprising an electron transport layer between the cathode and the light-emitting layer.

4. The display device according to claim 3, further comprising an electron injection layer between the cathode and the electron transport layer.

5. The display device according to claim 1, wherein the opening includes a plurality of the second openings.

6. The display device according to claim 1, further comprising a plurality of the pixels, wherein
the opening includes a plurality of the second openings, and
each of the second openings at least partially overlaps the first electrode of a different one of the plurality of pixels.

7. The display device according to claim 6, wherein the first opening includes a linear portion extending in a direction perpendicular to a direction in which the second openings extend from the first opening.

8. The display device according to claim 6, wherein
one or more of the second openings extend from the first opening in a direction, and
second openings other than the one or more second openings extend from the first opening in an opposite direction.

9. The display device according to claim 6, further comprising a plurality of the openings, wherein
in those two openings of which the first openings are adjacent to each other, the second opening of one of the two openings extends from the first opening in a different direction than the second opening of the other opening extends from the first opening.

10. The display device according to claim 1, wherein
the opening includes a plurality of the first openings and the single second opening, and
the single second opening extends from the plurality of first openings in such a direction that the single second opening overlaps the first electrode.

11. The display device according to claim 1, further comprising a plurality of the openings, wherein
in each of the plurality of openings, the second opening at least partially overlaps the first electrode.

12. The display device according to claim 1, wherein
the first opening includes a portion that appears circular in a plan view, and
the second opening includes a portion that appears rectangular in a plan view.

13. The display device according to claim 1, wherein the bank is made of a liquid-repelling material.

* * * * *